US007579307B2

(12) United States Patent
Suga et al.

(10) Patent No.: US 7,579,307 B2
(45) Date of Patent: Aug. 25, 2009

(54) CLEANER FOR SEMICONDUCTOR DEVICES

(75) Inventors: Shigemasa Suga, Noda (JP); Shigeru Kamon, Noda (JP); Takashi Yata, Osaka (JP); Akihiro Terai, Tokyo (JP)

(73) Assignees: Kishimoto Sangyo Co., Ltd., Osaka-Shi (JP); Fine Polymers Corporation, Tokyo (JP)

( * ) Notice: Subject to any disclaimer, the term of this patent is extended or adjusted under 35 U.S.C. 154(b) by 0 days.

(21) Appl. No.: 10/579,141

(22) PCT Filed: Nov. 24, 2004

(86) PCT No.: PCT/JP2004/017403

§ 371 (c)(1),
(2), (4) Date: Dec. 28, 2006

(87) PCT Pub. No.: WO2005/052109

PCT Pub. Date: Jun. 9, 2005

(65) Prior Publication Data

US 2007/0105735 A1 May 10, 2007

(30) Foreign Application Priority Data

Nov. 25, 2003 (JP) ............................ 2003-394271

(51) Int. Cl.
*H01L 21/02* (2006.01)

(52) U.S. Cl. ....................................... 510/175; 134/1.3

(58) Field of Classification Search ................. 510/175; 134/1.3
See application file for complete search history.

(56) References Cited

U.S. PATENT DOCUMENTS

| | | | | |
|---|---|---|---|---|
| 5,560,857 A * | 10/1996 | Sakon et al. | ................ | 510/175 |
| 5,763,375 A | 6/1998 | Kezuka et al. | | |
| 5,972,123 A * | 10/1999 | Verhaverbeke | ................. | 134/3 |
| 6,068,788 A | 5/2000 | Kezuka et al. | | |
| 6,686,322 B1 * | 2/2004 | Nohara et al. | ............... | 510/175 |
| 6,896,744 B2 * | 5/2005 | Morinaga et al. | ............. | 134/28 |

FOREIGN PATENT DOCUMENTS

| | | |
|---|---|---|
| EP | 0 649 168 A2 | 4/1995 |
| JP | 6-41770 A | 2/1994 |
| JP | 6-84866 A | 3/1994 |
| JP | 7-45600 A | 2/1995 |
| JP | 7-115077 A | 5/1995 |
| JP | 7-216392 A | 8/1995 |
| JP | 8-48996 A | 2/1996 |
| JP | 2001-44161 A | 2/2001 |
| WO | WO-97/18582 A1 | 5/1997 |
| WO | WO-00 66697 A1 | 11/2000 |

* cited by examiner

*Primary Examiner*—Gregory E Webb
(74) *Attorney, Agent, or Firm*—Birch, Stewart, Kolasch & Birch, LLP

(57) ABSTRACT

The invention has for its object the provision of a cleaner capable of removing particles and metal impurities present on the surface of a wafer without corrosion of wirings, gates or the like yet at normal temperature in a short period of time and with a one-pack type solution. To accomplish the above object, the invention provides a cleaner that is an aqueous solution containing phosphoric acid, hydrofluoric acid, and ammonia and/or amine, and having a pH ranging from 2 to 12, wherein the aqueous solution comprises 0.5 to 25 mass % of phosphoric acid, 0.1 to 10 mass % of ammonia and/or amine, and $5\times10^{-3}$ to 5.0 mass % of hydrofluoric acid.

10 Claims, No Drawings

CLEANER FOR SEMICONDUCTOR DEVICES

TECHNICAL ART

The present invention relates generally to a cleaner used for cleaning of electronic parts or the like, and more particularly to a cleaner for cleaning particles and/or metal impurities off wafers in the fabrication process of semiconductor devices.

BACKGROUND ART

The fabrication processes of semiconductor devices, etc. require reducing as much as possible contamination of the surface of a wafer with particles, metal ions or the like at each process step for the purpose of preventing the performance of the device from becoming worse and improving on yields, and the wafer surface is cleaned for the purpose of eliminating such contamination.

Among such cleaners as proposed recently in the art, there is a cleaner solution for semiconductor device substrates, which comprises (A) an alkaline component, (B) a nonionic surface active agent having an oxyalkylene group having 4 or more carbon atoms as a recurring unit, and (C) water (see, for in instance, patent publication 1). In general, however, the so-called RCA cleaning developed by RCA in 1970 has been commonly used for the elimination of particles, metal ions or other contaminants off the surfaces of Si wafers. This cleaning technique involves removing particles under the conditions of 70 to 80° C. and 10 minutes using an aqueous solution containing ammonium hydroxide and hydrogen peroxide and called the SC-1, and then eliminating metal ions under the conditions of 70 to 80° C. and 10 minutes using an aqueous solution containing hydrochloric acid and hydrogen peroxide and called SC-2. Instead of, or in addition to, these solutions, an aqueous solution containing sulfuric acid and hydrogen peroxide for removal of organic matters, an aqueous solution containing hydrofluoric acid for removal of Si oxide films, etc. may be used (see, for instance, non-patent publication 1).

In any case, however, this RCA cleaning has numerous problems. Specifically, there are:

1) redeposition of other contaminant species at a removal step for a certain contaminant species;
2) a more cleaning steps count because of involving the steps of SC-1 cleaning, water washing, and SC-2 cleaning;
3) an increase in the size of a cleaning system in association with the use of 300-mm wafers;
4) a relatively high content of hydrogen peroxide, which renders it impossible to apply the RCA cleaning to W or other metals badly vulnerable to hydrogen oxide;
5) a more cleaning steps count, which can never address the throughput of the cleaning system in non-batch-fashion, and
6) variations in the wafer surface, which are caused by heating in a non-batch fashion.

Thus, the development of a cleaner free from such problems is now in demand.

Patent Publication 1: JP(A)2003-109930

Non-Patent Publication 1: W. Kerh and D. A. Puotinen, RCA Review, 31, 187 (1970)

DISCLOSURE OF THE INVENTION

Problem to be Solved by the Invention

The invention has for its object the provision of a cleaner that is capable of removing particles, and metal impurities-off the surface of a wafer without corrosion of wirings, gates, etc. yet at normal temperature in short periods of time using a one-pack type solution.

Means for Solving the Problem

The above object is achievable by the invention embodied as follows:

(1) A cleaner that is an aqueous solution containing phosphoric acid, hydrofluoric acid, and ammonia and/or amine and having a pH ranging from 2 to 12, wherein said aqueous solution contains:

0.5 to 25 mass % of phosphoric acid, 0.1 to 10 mass % of ammonia and/or amine, and $5\times10^{-3}$ to 5.0 mass % of hydrofluoric acid.

(2) The cleaner according to (1) above, wherein the pH is regulated by phosphoric acid.

(3) The cleaner according to (1) or (2) above, which further includes a surface active agent and/or a chelate agent.

(4) The clearer according to any one of (1) to (3) above, which further include hydrogen peroxide.

(5) The cleaner according to any one of (1) to (4) above, which is used for cleaning particles and/or metal impurities off the surface of a semiconductor device substrate.

Advantages of the Invention

According to the invention, particles, and metal impurities can be removed off the surface of a wafer at normal temperature in short periods of times using a one-pack type solution, and there is no corrosion of wirings, gates, etc.

BEST MODE FOR CARRYING OUT THE INVENTION

The present invention is now explained in more details.

The cleaner of the invention is an aqueous solution that contains phosphoric acid, hydrofluoric acid, and ammonia and/or amine and has a pH ranging from 2 to 12, wherein said aqueous solution contains:

0.5 to 25 mass % of phosphoric acid, 0.1 to 10 mass % of ammonia and/or amine, and $5\times10^{-3}$ mass % (50 ppm) to 5.0 mass % of hydrofluoric acid.

The cleaner of such pH range and composition is to clean particles and/or metal impurities off the surface of a wafer (substrate) in the fabrication process of electronic parts in general, and semiconductor devices in particular; it enables particles and metal impurities to be removed at the same time with a one-pack type solution. Under the conditions of normal temperature (temperatures of about 10 to 35° C., preferably about 15 to 30° C.) and about 10 seconds to 10 minutes, preferably about 10 seconds to 5 minutes, sufficient removal is achievable.

Thus, the invention has the advantages of being simpler with higher efficiency, because the cleaner treatment can be done at normal temperature with no application of special heating and in a relatively short period of time, using a one-pack type solution. Moreover, there is no corrosion of wirings, gates, etc. on the wafer, and there is no more etching of the surface of the wafer itself than required, either, leading to undeteriorative devices with a fewer defectives count.

The particles here refer generally to fine particles derived from wafer processing steps, inclusive of a deposition of dust coming from outside, whereas the metal impurities here refer generally to depositions of metal contaminants coming from outside or processing steps. Note that there is no telling difference between them; matter belonging to one is often included in another. Metal species having contamination problems, for instance, include K, Ca, Ti, Cr, Mn, Fe, Ni, Cu, and Zn.

Why the pH and composition of the inventive cleaner are limited to the ranges as mentioned above is now explained.

The reason for limiting pH to the range of 2 to 12 is that at less than pH 2, the ability of the cleaner to remove particles becomes low and at higher than pH 12, on the other hand, the surface of the substrate roughens. Especially for the purpose of improving on the ability of the cleaner to remove metal impurities, the pH should preferably be lower than 6. In other words, the preferable pH range is from 2 to 6, and regulation of pH to about 4 is particularly preferable in view of a tradeoff between the abilities of the cleaner to remove particles and metal impurities.

Referring to the reason for limiting the content of phosphoric acid to 0.5 to 25 mass %, the cleaning effect of the cleaner becomes low at less than 0.5 mass %, and the upper limit is set at 25 mass % because of coming close to a saturation concentration.

The preferable range for the content of phosphoric acid is 0.5 to 10 mass %.

The content here is calculated on a $H_3PO_4$ basis.

Referring to the reason for limiting the content of ammonia and/or amine to 0.1 to 10 mass %, the cleaning effect of the cleaner becomes low at less than 0.1 mass %, and the upper limit is set at 10 mass % because of coming close to a saturation concentration.

The reasons for limiting the content of hydrofluoric acid to $5\times10^{-3}$ to 5.0 mass % are that at less than $5\times10^{-3}$ mass %, the etching effect of the cleaner on surface cleaning becomes slender, and at greater than 5.0 mass %, etching proceeds too much and there is a growing toxicity as well.

The preferable range for the content of hydrofluoric acid is $2.0\times10^{-2}$ to 2.0 mass %.

The pH of the inventive cleaner, because of having a broader buffer area, should preferably be regulated with the use of phosphoric acid. The content of phosphoric acid here must be within the inventive range; if necessary, other inorganic or organic acids could be used in an amount without detrimental to the cleaning effect. Although ammonia or amine is used as the alkali agent, it is understood that for much the same reason, other alkali agent could be used in an amount without detrimental to the cleaning effect.

Further, the cleaner of the invention should preferably include a surface active agent and/or a chelate agent. This works more favorably for the cleaning effect.

The content of the surface active agent and/or the chelate agent should preferably be $5\times10^{-4}$ (5 ppm) to 1.0 mass %, and especially $5\times10^{-3}$ to 0.1 mass %. The more that content, the more apt the cleaner is to bubble, and the smaller, the lower the cleaning effect becomes.

Further, the cleaner of the invention should preferably contain hydrogen peroxide. This works more favorably for the cleaning effect on metal impurities.

As the content of hydrogen peroxide grows large, there is a possibility that even metals (for instance, W) that provide wiring or gate materials may corrode away, and so that content should preferably 0.1 to 5.0 mass %. This works favorably for removal of Cr and Cu in particular.

While the phosphoric acid used for the inventive cleaner may generally be orthophosphoric acid ($H_3PO_4$), it is understood that condensed phosphoric acid could also be used. The condensed phosphoric acid may be either a poly-phosphoric acid represented by $H_{n+2}P_nO_{3n+1}$ or a meta-phosphoric acid represented by $(HPO_3)_n$, and may occasionally include what is called an ultraphosphoric acid. In general, the condensed phosphoric acid is a mixture of such phosphoric acids as mentioned above, and includes orthophosphoric acid as well. In the above formula, n is the degree of polymerization. The poly-phosphoric acid would comprise those with n=2 to 12, and the metaphosphoric acid would comprise those with n=3 to 14.

Such phosphoric acid could be used in salt form. In particular, it should preferably be used in ammonium salt form (inclusive of primary to quaternary ammonium salts), because ammonia and/or amine are concurrently present.

Usually, orthophosphoric acid, an ammonium salt of orthophosphoric acid, etc. are preferably used.

These may be used alone or in combination of two or more.

The ammonia used for the inventive cleaner may be added as ammonia water or in an ammonium salt form. Among others, the ammonia should preferably be added in the form of an ammonium salt ($NH_4$ salt) of phosphoric acid, as described above.

The amine used for the inventive cleaner may be any one of primary to tertiary amines or their primary to quaternary ammonium salts.

The primary amine, for instance, includes mono-ethanolamine, diglycolamine (DGA), tris(hydroxymethyl)-aminomethane, isopropanolamine, cyclohexylamine, aniline, and toluidine. The secondary amine, for instance, includes diethanolamine, morpholine, and N-monomethyl-toluidine (pyrazine). The tertiary amine, for instance, include triethanolamine, triethylamine, trimethylamine, 1-methylimidazole, and N-diethyltoluidine. The primary to quaternary ammonium salts, for instance, include tetramethylammonium, tetra-N-butylammonium, and cholines $[(CH_3)_nN(C_2H_4OH)_{4-n}$ where n is an integer of 0 to 4].

When it comes to the primary to the quaternary ammonium salt, it should preferably used in a salt form with phosphoric acid, as already stated.

For ammonia and/or amine, ammonium salts of phosphoric acid (inclusive of the primary to the quaternary ammonium salt) or the like should preferably be used. Alternatively, the anionic surface active agent or chelate agent may be used to incorporate ammonia and/or amine in the inventive cleaner.

These may be used alone or in combination of two or more.

The surface active agent preferably used for the inventive cleaner is preferably an anionic surfactant of any one of the carboxylic acid, sulfonic acid, sulfate and phosphate types having an alkyl group having about 11 to 20 carbon atoms (preferably a straight chain alkyl group). Particular preference is given to the surfactant of the sulfonic acid type.

In this case, use may be made of a surfactant comprising a mixture of those having alkyl groups with different carbon atoms. Although no particular limitation is imposed on pair ions of sulfonic acid, preference is given to ammonium ions (for instance, $NH_4^+$), etc.

For instance, preference is given to an anionic surfactant of the sulfonic acid type where alkyl straight chains having 11 to 16 carbon atoms are present in mixed form with $NH_4^+$ as pair ions.

The surface active agents may be used alone or in combination of two or more.

The chelate agent used here preferably includes ethylenediaminetetraacetic acid (EDTA), diethylenetriaminepentaacetic acid (DTPA), triethylenetetraminehexaacetic acid (TTHA), hydroxyethylethylenediaminetriacetic acid (HEDTA), nitrogenous carboxylic acids such as nitrilotriacetic acid, ethylenediaminetetrakis(methylenesulfonic acid) (EDTPO), nitrogenous sulfonic acids such an propylenediaminetetra (tetramethylenesulfonic acid) (PDTMP), ethylenediaminediorthohydroxyphenylacetic acid (EDDHA) and its derivatives, and N,N'-bis(2-hydroxybenzyl)ethylenediamine-N,N'-diacetic acid (HBED).

These chelate agents may be used in acid form or salt form such as ammonium salt.

The chelate agents may be used alone or in combination of two or more.

For the water, usually, use is made of deionized water, ultrapure water, electrolytic ion water, or the like.

The hydrofluoric acid used here may be a commercial one, and the hydrogen peroxide used here may be a commercial one.

The cleaner of the invention is used in direct contact with a wafer, for instance, in a dip mode where wafers are dipped in a cleaner filled in a cleaning tank, a spin mode where wafers are spun at fast speed while a cleaner is injected from a nozzle over wafers, or a spray mode where a cleaner solution is sprayed over wafers. A system for implementing such cleaning is broken down into a batch type cleaning system where a plurality of wafers received in a cassette are simultaneously cleaned, and a non-batch type cleaning system wherein a single one wafer attached to a holder is cleaned.

Among others, preference is given to the so-called double-fluid spray mode cleaning technique using a non-batch type cleaning system, wherein a cleaner is discharged onto a wafer or a cleaner layer is formed (or otherwise built) on the wafer, after which an inert gas such as argon and deionized water or the cleaner (solution) are concurrently sprayed onto the wafer. This is followed by the steps of water washing and drying.

Details of that double-fluid spray mode are set forth in, for instance, JP(A)'s 10-156229, 2001-191040 and 2003-145062.Usually, the double-fluid spray mode is carried out under the cleaning conditions of a temperature of about 20 to 60° C. and a time period of about 5 to 20 seconds. Note here that the total cleaning time including water washing and drying times is about 100 to 200 seconds.

The cleaner of the invention is useful for the fabrication process of electronic parts in general; however, it is most preferably used for cleaning wafers in the fabrication process of semiconductor devices. In particular, the cleaner of the invention lends itself to the cleaning of Si wafers combined with gate electrode material formed of W. Moreover, it is well fit for the cleaning of multilayer wafers of thermal silicon oxide (Th—$SiO_2$).

In general, the cleaner of the invention is preferably applied to materials such as W, WN, WSi, CoSi, poly-Si (polysilicon), D-poly-Si (doped polysilicon), SiN, α-Si (amorphous silicon), and Th—$SiO_2$ (thermal silicon oxide).

By cleaning treatment using the inventive cleaner, particles or metal impurities can be removed off the surface of a wafer. Even with particles or metal ions present in the cleaner solution, their redeposition can be held back.

How many particles are removed is checked up by counting the number of particles on the surface of a wafer, using a substrate surface inspector.

How much metal impurities are removed is checked up by measuring the amount of metal ions on the surface of a wafer, using a total-reflection fluorescent X-ray analyzer (TXRF).

To what degree redeposition occurs is checked up in the same manner as described above.

Whether or not the redeposition of particles is held back is determined by use of a ξ (zeta) potential that becomes an index to the surface potential of a wafer. The ξ potential of the wafer surface is measured upon contact of it with a cleaner solution, using an electrophoretic light scattering photometer. In an aqueous dispersion colloid system, when the absolute value, with the same sign, of a ξ potential that becomes an index to the aggregation of colloid particles is 15 mV or greater, electrostatic repulsion is supposed to take place. The absolute value of the ξ potential being 15 mV or greater is used as the criterion of whether or not the deposition of particles onto the wafer surface is held back. The presumption here is that the ξ potentials of the wafer surface and the particle surface have the same sign, and most particles would satisfy this condition. For this reason, the absolute value of the ξ potential of the wafer surface being 15 mV or greater is herein used as the criterion of whether or not the deposition of particles is held back. For measurement of such ξ potential and its details, see "Zeta Potential: Physical Chemistry of Fine Particles Interfaces" published by Scientist Co., Ltd., 1995, and Fumio Kitahara and Kunio Furusawa, "Latest Colloid Chemistry", Kodansha Scientific Co., Ltd.

The present invention is now explained more specifically with reference to examples. In what follows, unless otherwise specified, "%" means "mass %", and unless otherwise stated, "ppm" and "ppb" are given on a mass basis.

EXAMPLE 1

Cleaner Preparation

A monomer ammonium phosphate (phosphoric acid 20%•ammonia 7.4%), 20% phosphoric acid, 50% hydrofluoric acid and a sulfonic acid type surfactant were mixed together in such a way as to give the compositions shown in Table 1 at pH regulated to 2 to 6.The sulfonic acid type surfactant had alkyl straight chains having 11 to 16 carbon atoms in mixed form, with $NH_4^+$ as pair ions.

Testing

About 3,000 to 4,000 Si particles (each having a particle diameter of 0.12 μm or greater) were forcedly deposited onto an 8-inch (20.32 cm) bare silicon (Bare-Si) wafer washed with APM ($NH_4OH/H_2O_2/H_2O$ mixture). This wafer was then cleaned with a double-fluid spray mode non-batch type cleaning system using each of the cleaners (cleaner solutions) prepared as mentioned above.

In the cleaner solution treatment, 40 ml of the cleaner in layer form were built on the wafer at 25° C. for 40 to 60 seconds and shaken off. Then, double-fluid spraying was applied twice to the wafer under the conditions of a $N_2$ flow rate of 40 NL (normal litter: a volume at 0° C. and 1 atm) and a deionized water (DIW) flow rate of 0.2 L/min. After this treatment, rinsing was applied at 25° C. for 60 seconds to the wafer under the conditions of a wafer rpm of 1,000 rpm and a DIW flow rate of 1.5 L/min., followed by drying at 25° C. and 1,500 rpm for 60 seconds.

The number of particles (each having a particle diameter of 0.12 mm or greater) before and after such cleaning operation was counted with a substrate surface inspector SurfScan 6420 (KLA-Tencor) to calculate removal rates (number base percentage). Film losses are given in terms of a thickness loss per one minute (Å($\times 10^{-1}$ nm)/min).

The results of testing are set out in Table 2.

TABLE 1

| Cleaner | Phosphoric Acid (%) | Ammonia (%) | Hydrofluoric*[1] Acid (%) | Surfactant*[2] (ppm) | pH |
|---|---|---|---|---|---|
| 1 | 5 | 0 | 0.1 | 50 | 2 |
| 2 | 5 | 0.7 | 0.1 | 50 | 3 |
| 3 | 5 | 0.9 | 0.1 | 50 | 4 |
| 4 | 5 | 1.1 | 0.2 | 50 | 5 |

TABLE 1-continued

| Cleaner | Phosphoric Acid (%) | Ammonia (%) | Hydrofluoric*1 Acid (%) | Surfactant*2 (ppm) | pH |
|---|---|---|---|---|---|
| 5 | 5 | 1.9 | 1.0 | 50 | 6 |
| 6 | 5 | 0.7 | 0 | 50 | 3 |

*1Hydrofluoric acid, when added to the cleaner, was used in such a way as to give much the same $SiO_2$ film loss.
*2The surfactant was of the sulfonic acid type.

TABLE 2

| Cleaner | Removal Rate (%) | $SiO_2$ Film Loss (Å (×10$^{-1}$ nm)) | Operating Conditions |
|---|---|---|---|
| 1 | 83.2 | 1.8 | 25° C. 60 seconds |
| 2 | 89.8 | 2.2 | 25° C. 60 seconds |
| 3 | 94.2 | 2.1 | 25° C. 60 seconds |
| 4 | 93.1 | 2.3 | 25° C. 60 seconds |
| 5 | 95.3 | 2.0 | 25° C. 60 seconds |
| 6 | 15.2 | 0 | 25° C. 60 seconds |

From the above results, it has been found that at pH 2 to 4 (cleaners 1 to 3), the particle removal rate increases with increasing pH, and at pH 4 to 6 (cleaners 3 to 5), much the same removal capability is achievable. That is, the results have taught that as the pH grows higher in the above range, the particles are more effectively removed, and the pH should preferably be set at greater than 4.

A comparison of cleaner 2 with 6 has indicated that the removal rate becomes low with no addition of hydro-fluoric acid and no application of etching, either, and so the addition of hydrofluoric acid and the application of an about 2 Å (0.2 nm) etching of $SiO_2$ are of significance. This $SiO_2$ is an oxide film present on the wafer surface. Thus, etching was measured in terms of a thermal oxide film loss, using a reflection type film thickness meter (F20Filmetrics).

EXAMPLE 2

Cleaner Preparation

A monomer ammonium phosphate (phosphoric acid 20%•ammonia 7.4%), 20% phosphoric acid, 50% hydrofluoric acid and a sulfonic acid type surfactant (the same as in Example 1) were mixed together in such a way as to give the compositions shown in Table 3 at a pH regulated to 4.

Testing

The same operation as in Example 1 was carried out to calculate the removal rate. However, the cleaner solution treating time at the cleaning step was set at 60 seconds, and the double-fluid spraying was done at a $N_2$ flow rate of 13 NL and a DIW flow rate of 1.5 L/min.

The results of testing are set out in Table 4.

TABLE 3

| Cleaner | Phosphoric Acid (%) | Ammonia (%) | Hydrofluoric*1 Acid (%) | Surfactant*2 (ppm) | pH |
|---|---|---|---|---|---|
| 7 | 5 | 0.9 | 0.1 | 0 | 4 |
| 8 | 5 | 0.9 | 0.1 | 50 | 4 |

TABLE 4

| Cleaner | Removal Rate (%) | |
|---|---|---|
| 82.6 | 8 | 92.8 |

From the above results in general, and from a comparison of cleaner 7 with 8 in particular, it has been found that the addition of the surfactant works more favorably for particle removal.

EXAMPLE 3

Cleaner Preparation

A monomer ammonium phosphate (phosphoric acid 20%•ammonia 7.4%), 20% phosphoric acid, 50% hydrofluoric acid and a sulfonic acid type surfactant (the same as in Example 1) were mixed together in such a way as to give the compositions shown in Table 5 at a pH regulated to 3 to 6.

Testing

A Bare-Si wafer, and a multilayer wafer of thermal silicon oxide (Th—$SiO_2$) was cut into 3 cm×6 cm, and then dipped in DHF (HF:$H_2O$ (by volume)=1:100) at 25° C. for 1 minute for removal of a natural oxide film. Thereafter, the Bare-Si wafer was dipped in APM ($NH_4OH$:$H_2O_2$:$H_2O$ (by volume)=1:1:5) at 60° C. for 10 minutes to form a chemical oxide film on it. The ξ potentials of the surfaces of these wafers upon contact with the cleaner solution were measured using a laser ξ potentiometer (ELS-8000 made by Ohtsuka Electronics Co., Ltd.).

The results are set out in Table 6.

TABLE 5

| Cleaner | Phosphoric Acid (%) | Ammonia (%) | Hydrofluoric*1 Acid (%) | Surfactant*2 (ppm) | pH |
|---|---|---|---|---|---|
| 9 | 5 | 0.7 | 0.1 | 0 | 3 |
| 10 | 5 | 0.7 | 0.1 | 50 | 3 |
| 11 | 5 | 0.9 | 0.1 | 0 | 4 |
| 12 | 5 | 0.9 | 0.1 | 50 | 4 |
| 13 | 5 | 1.1 | 0.2 | 0 | 5 |
| 14 | 5 | 1.1 | 0.2 | 50 | 5 |
| 15 | 5 | 1.9 | 1.0 | 0 | 6 |

TABLE 6

| | | | ξ Potential (mV) | |
|---|---|---|---|---|
| Cleaner | pH | Surfactant | Bare-Si | Th—$SiO_2$ |
| 9 | 3 | not used | 1.81 | 2.21 |
| 10 | 3 | used | −21.88 | −8.01 |
| 11 | 4 | not used | 1.15 | −4.69 |
| 12 | 4 | used | −27.61 | −16.67 |
| 13 | 5 | not used | −19.80 | −10.08 |
| 14 | 5 | used | −43.38 | −8.74 |
| 15 | 6 | not used | −28.07 | −19.79 |
| 16 | 6 | used | −35.10 | −22.30 |

From the above results, it has been found that the absolute value of the ξ potential increases with increasing pH. It has also been found that at the same pH, the absolute value of the ξ potential grows large by the addition of the surfactant. The general criterion of holding back deposition by electrostatic repulsion would require that the ξ potential have the same sign and an absolute value of 15 mV or greater. As can be seen from these results, it is thus preferable to regulate the pH to 4 or greater and to rely upon the addition of the surfactant as well.

EXAMPLE 4

Cleaner Preparation

A monomer ammonium phosphate (phosphoric acid 20%•ammonia 7.4%), 20% phosphoric acid, 50% hydrofluoric acid and a sulfonic acid type surfactant (the same as in Example 1) were mixed together in such a way as to give the compositions shown in Table 7 at a pH regulated to 3.

Testing

The same operation as in Example 1 was carried out to calculate the removal rate. However, the cleaner solution treating time at the cleaning step was set at 60 seconds, and the same conditions as in Example 1 were otherwise applied.

The results of testing are set out in Table 8.

TABLE 7

| Cleaner | Phosphoric Acid (%) | Ammonia (%) | Hydrofluoric*1 Acid (%) | Surfactant*2 (ppm) | pH |
|---|---|---|---|---|---|
| 17 | 5 | 0.7 | 0.1 | 50 | 3 |
| 18 | 2.5 | 0.35 | 0.1 | 50 | 3 |
| 19 | 1.25 | 0.175 | 0.1 | 50 | 3 |
| 20 | 0.5 | 0.07 | 0.1 | 50 | 3 |

TABLE 8

| Cleaner | Removal Rate (%) |
|---|---|
| 17 | 89.8 |
| 18 | 81.2 |
| 19 | 76.5 |
| 20 | 73.8 |

From the above results, it has been found that as the concentrations of phosphoric acid and ammonia decrease, there is a removal rate drop. Therefore, it has been understood that phosphoric acid and ammonia take a part in improvements in the particle removal capability.

EXAMPLE 5

Cleaner Preparation

A monomer ammonium phosphate (phosphoric acid 20%•ammonia 7.4%), 20% phosphoric acid, 50% hydrofluoric acid, a sulfonic acid type surfactant (the same as in Example 1), and 30% hydrogen peroxide were mixed together at such concentrations as set out in Table 9 at a pH regulated to 3 to 6.

Testing

An 8-inch (20.32 cm) Bare-Si wafer washed with APM and HFM (a mixture of hydrochloric acid, hydrogen peroxide and water), and then dipped in a chemical solution with 14 ppb of metal ions (K, Ca, Ti, Cr, Mn, Fe, Ni, Cu, Zn) added to it at 25° C. for 1 minute. Thereafter, the wafer was rinsed with DIW to measure the amount (atoms/$cm^2$: the number of metal ions per 1 $cm^2$) of metal ions after the treatment, using a total-reflection fluorescent X-ray analyzer (TXRF (Rigaku)).

The results are set out in Table 10.

TABLE 9

| Cleaner | Phosphoric Acid (%) | Ammonia (%) | Hydrofluoric Acid*1(%) | Surfactant*2 (ppm) | Hydorgen Peroxide (%) | pH |
|---|---|---|---|---|---|---|
| 21 | 5 | 0.7 | 0.1 | 50 | — | 3 |
| 22 | 5 | 0.9 | 0.1 | 50 | — | 4 |
| 23 | 5 | 1.1 | 0.2 | 50 | — | 5 |
| 24 | 5 | 1.9 | 1.0 | 50 | — | 6 |
| 25 | 5 | 0.9 | 0.1 | 50 | 0.3 | 4 |

TABLE 10

Unit: atoms/$cm^2$

| Cleaner | K | Ca | Ti | Cr | Mn | Fe | Ni | Cu | Zn |
|---|---|---|---|---|---|---|---|---|---|
| Initial*1 | ND*2 | ND | ND | Nd | ND | ND | ND | ND | ND |
| 21 | ND | ND | ND | $5.99 \times 10^{10}$ | ND | ND | ND | $4.98 \times 10^{12}$ | ND |
| 22 | ND | ND | ND | $3.93 \times 10^{11}$ | ND | ND | ND | $4.39 \times 10^{12}$ | ND |
| 23 | ND | ND | ND | $6.51 \times 10^{11}$ | ND | ND | ND | $2.32 \times 10^{13}$ | ND |
| 24 | ND | ND | ND | $1.36 \times 10^{11}$ | ND | ND | ND | $2.58 \times 10^{13}$ | ND |
| 25 | ND | ND | ND | ND | ND | ND | ND | ND | ND |

*1indicates that the sample has been washed with APM and HPM.
*2indicates that ND is an acronym of not detected.

From the above results, it has been found that at any pH, there is no redeposition of elements other than Cu and Cr. It has also been found that for Cu, the pH should preferably be lower than 4, because the amount of re-deposition grows as large as $10^{13}$ at pH 5 or greater. It has further been found that the addition of 0.3% hydrogen peroxide to the chemical solution of pH 4 eliminates re-deposition; the addition of a tad hydrogen peroxide works for prevention of redeposition.

EXAMPLE 6

Cleaner Preparation

Similar cleaners were prepared as in cleaners 21-24 in Table 9.

Testing

A 8-inch Bare-Si wafer washed with APM and HFM was forcedly contaminated with metal ions (K, Ca, Ti, Cr, Mn, Fe, Ni, Cu, Zn) to the order of $10^{13}$, after which it was cleaned in a non-batch type cleaning system using each of the cleaners prepared as mentioned above, thereby measuring the amount of metal ions before and after the treatment as in Example 5.

The cleaning operation using the cleaner solution was performed as in Example 1 with the exception that the double-fluid spraying was not used.

The results are set out in Table 11.

TABLE 11

Unit: atoms/$cm^2$

| Cleaner | K | Ca | Ti | Cr | Mn |
|---|---|---|---|---|---|
| Initial*1 | $1.00 \times 10^{14}$ | $2.22 \times 10^{14}$ | $9.41 \times 10^{13}$ | $9.60 \times 10^{13}$ | $9.43 \times 10^{13}$ |
| 21 | ND*2 | ND | ND | ND | ND |
| 22 | ND | ND | ND | $1.95 \times 10^{10}$ | ND |
| 23 | ND | $1.14 \times 10^{11}$ | ND | ND | ND |
| 24 | ND | $6.22 \times 10^{11}$ | ND | $1.68 \times 10^{10}$ | ND |

| Cleaner | Fe | Ni | Cu | Zn |
|---|---|---|---|---|
| Initial | $8.61 \times 10^{13}$ | $8.71 \times 10^{13}$ | $8.16 \times 10^{13}$ | $8.44 \times 10^{13}$ |
| 21 | ND | ND | $4.79 \times 10^{12}$ | ND |
| 22 | ND | ND | $3.11 \times 10^{11}$ | ND |
| 23 | $3.10 \times 10^{10}$ | ND | $3.75 \times 10^{13}$ | ND |
| 24 | $2.71 \times 10^{10}$ | ND | $5.97 \times 10^{13}$ | ND |

*1 indicates that the sample has been washed with APM and HPM.
*2 indicates that ND is an acronym of not detected.

From the above results, it has been found that at pH 4 or lower, only two elements Cu and Cr remain, whereas at pH 5 or greater, Ca and Fe remain in addition to two such elements. At pH 5 or greater, the amount of remaining Cu is substantially on the order of $10^{13}$, indicating that Cu is hardly removed and so the pH should preferably be 4 or lower.

EXAMPLE 7

A cleaner solution was prepared as in cleaner 22 in Table 9, and a multilayer wafer or a metal test piece of each material shown in Table 12 was dipped in the cleaner solution to measure a film loss using a reflection type film thickness meter (F20 Filmetrics) and an induction coupling plasma mass analysis technique: ICP-MS(SPQ9000: made by SII).

What was dipped in the solution was W, WN, CoSi, Poly-Si (polysilicon), D-Poly-Si (doped polysilicon), SiN, α-Si (amorphous silicon), thermal silicon oxide (Th—$SiO_2$), and TEOS (tetraethoxysilane). W was cut to 1 cm×1 cm with a thickness of 0.1 cm, and other metals were each cut to 2 cm×2 cm with a thickness selected from the range of 100 to 300 nm, for staking on an Si wafer. Film losses are given in thickness losses (Å(×$10^{-1}$ nm)/min).

The results are set out in Table 12.

TABLE 12

Unit: Å(×$10^{-1}$ nm)/min

| Temp. (° C.) | W | WN | WSi | CoSi | Poly-Si | D-Poly-Si | SiN | α-Si | Th-$SiO_2$ | TEOS |
|---|---|---|---|---|---|---|---|---|---|---|
| 25 | 0.02 | 0.17 | 0.66 | <0.03 | 0.08 | 0.22 | 0.21 | 0.08 | 1.81 | 10.90 |
| 40 | 0.04 | 0.46 | 1.30 | <0.03 | 0.05 | 0.57 | 0.37 | 0.23 | 2.00 | 13.50 |

From the results set out in Table 12, it has been found that the film losses of gate materials such as W, Poly-Si and α-Si and Si substrates are much more reduced, and there is the capability of the cleaner to lift off particles-by cutting slightly away SiN, and Th—$SiO_2$.

Thus, when cleaning is done with the inventive cleaner, the film losses of materials likely to come in contact with it, except TEOS, are much more reduced, and some film losses work for removal of particles.

What we claim is:

1. A cleaner that is an aqueous solution containing phosphoric acid, hydrofluoric acid, and ammonia and/or amine and having a pH ranging from 2 to 6, wherein said aqueous solution contains:

0.5 to 25 mass % of phosphoric acid,
0.1 to 10 mass % of ammonia and/or amine, and
0.1 to 5.0 mass % of hydrofluoric acid.

2. The cleaner according to claim 1, wherein the pH is regulated by phosphoric acid.

3. The cleaner according to claim 1 or 2, which further includes a surface active agent and/or a chelate agent.

4. The cleaner according to claim 1, which further includes hydrogen peroxide.

5. The cleaner according to claim 1, which is used for cleaning off particles and/or metal impurities out of the surface of a semiconductor device substrate.

6. The cleaner according to claim 2, which further includes hydrogen peroxide.

7. The cleaner according to claim 3, which further includes hydrogen peroxide.

8. The cleaner according to claim 2, which is used for cleaning off particles and/or metal impurities out of the surface of a semiconductor device substrate.

9. The cleaner according to claim 3, which is used for cleaning off particles and/or metal impurities out of the surface of a semiconductor device substrate.

10. The cleaner according to claim 4, which is used for cleaning off particles and/or metal impurities out of the surface of a semiconductor device substrate.

* * * * *